US006833051B2

(12) United States Patent
Kazumi et al.

(10) Patent No.: US 6,833,051 B2
(45) Date of Patent: Dec. 21, 2004

(54) PLASMA PROCESSING APPARATUS AND METHOD

(75) Inventors: Hideyuki Kazumi, Hitachi (JP); Tsutomu Tetsuka, Ibaraki-ken (JP); Ryoji Nishio, Mito (JP); Masatsugu Arai, Kudamatsu (JP); Ken Yoshioka, Hikari (JP); Tsunehiko Tsubone, Hikari (JP); Akira Doi, Ibaraki-ken (JP); Manabu Edamura, Ibaraki-ken (JP); Kenji Maeda, Matsudo (JP); Saburo Kanai, Hikari (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/139,281

(22) Filed: May 7, 2002

(65) Prior Publication Data
US 2002/0124963 A1 Sep. 12, 2002

Related U.S. Application Data

(60) Continuation of application No. 09/909,871, filed on Jul. 23, 2001, now abandoned, which is a division of application No. 09/732,307, filed on Dec. 8, 2000, now Pat. No. 6,481,370, which is a division of application No. 08/979,949, filed on Nov. 26, 1997, now Pat. No. 6,180,019.

(30) Foreign Application Priority Data

Nov. 27, 1996 (JP) .............................................. 8-315885

(51) Int. Cl.$^7$ ......................... H05H 1/00; C23C 16/00
(52) U.S. Cl. ............................... 156/345.48; 118/723 I
(58) Field of Search .................. 156/345.48, 345.43, 156/345.47; 118/723 I, 723 IR, 723 E; 315/111.51, 111.71; 204/298.34, 298.01

(56) References Cited

U.S. PATENT DOCUMENTS

| | | | |
|---|---|---|---|
| 4,362,632 A | 12/1982 | Jacob | |
| 4,464,223 A * | 8/1984 | Gorin | 156/345.43 |
| 5,234,529 A | 8/1993 | Johnson | |
| 5,514,246 A * | 5/1996 | Blalock | 438/694 |
| 5,529,657 A | 6/1996 | Ishii | 118/723 |
| 5,534,231 A | 7/1996 | Savas | 216/67 |
| 5,614,055 A * | 3/1997 | Fairbairn et al. | 156/345.33 |
| 5,647,913 A | 7/1997 | Blalock | |
| 5,650,032 A | 7/1997 | Keller et al. | 156/345 |
| 5,779,849 A | 7/1998 | Blalock | 118/723 |
| 5,811,022 A | 9/1998 | Savas et al. | 216/68 |
| 5,855,685 A | 1/1999 | Tobe et al. | 118/723 |
| 5,865,896 A * | 2/1999 | Nowak et al. | 118/723 I |
| 5,888,414 A | 3/1999 | Collins et al. | 216/68 |
| 5,891,349 A | 4/1999 | Tobe et al. | 216/68 |
| 5,891,350 A | 4/1999 | Shan et al. | 216/71 |
| 5,897,712 A | 4/1999 | Hanawa et al. | 118/723 |
| 5,904,778 A | 5/1999 | Lu et al. | 118/723 |
| 5,965,034 A | 10/1999 | Vinogradov | 216/68 |
| 5,976,308 A | 11/1999 | Fairbairn et al. | 156/345 |
| 6,013,580 A | 1/2000 | Yanagida | 438/710 |
| 6,077,384 A * | 6/2000 | Collins et al. | 156/345.48 |
| 6,189,484 B1 * | 2/2001 | Yin et al. | 118/723 I |

FOREIGN PATENT DOCUMENTS

| | | |
|---|---|---|
| EP | 0742577 | 11/1996 |
| WO | WO91/10341 | 7/1991 |

* cited by examiner

Primary Examiner—Parviz Hassanzadeh
(74) Attorney, Agent, or Firm—Antonelli, Terry, Stout & Kraus, LLP

(57) ABSTRACT

A plasma processing apparatus includes a vacuum chamber having a structure that surrounds a space where plasma is generated, a sample stage disposed in the chamber on which a sample to be processed is placed and coil antenna providing an electric field to the space. The structure has a non-conductive member surrounding the space and a conductive member covering the non-conductive member, both of which are disposed between the antenna and the space. The conductive member is electrically floated at least when the plasma is generated.

13 Claims, 16 Drawing Sheets

FIG. 15

| SWITCH 21 | SWITCH 22 | REMOVED AMOUNT OF WALL | RF POWER FOR PLASMA IGNITION |
|---|---|---|---|
| ON | ON | 0.2 | 400W |
| ON | OFF | 1.0 | 10W |
| OFF | ON | 0.2 | 800W |
| OFF | OFF | 0.2 | 800W |

PLASMA PROCESSING APPARATUS AND METHOD

This application is a Continuation application of application Ser. No. 09/909,871, filed Jul. 23, 2001, now abandoned, which is a Divisional application of application Ser. No. 09/732,307, filed Dec. 8, 2000, now U.S. Pat. No. 6,481,370, which is a Divisional application of application Ser. No. 08/979,949, filed Nov. 26, 1997, now U.S. Pat. No. 6,180,019.

BACKGROUND OF THE INVENTION

The present invention relates to a plasma processing apparatus for surface treatment to etch a substrate or to form a thin film with a plasma by supplying a radio-frequency electric field to an antenna, generating an electric field, and thereby generating a plasma by the electric field, and a method of using this apparatus. More particularly, the invention relates to a semiconductor processing apparatus for processing a semiconductor device, and a method of using this apparatus.

In a semiconductor processing apparatus for generating a plasma by induction by feeding an electric current to a coil-shaped antenna, there is a problem that a vacuum chamber wall made of an non-conductive material and enclosing a plasma generating unit so as to establish a vacuum atmosphere is partly removed by the plasma. In order to solve this problem, there has been conceived a method using a field called the "Faraday shield", as disclosed in Japanese Patent Laid-Open No. 502971/1993. If the Faraday shield is used, however, the plasma ignitability is so deteriorated that the plasma is not ignited unless a voltage as high as tens of KV is applied to the feeding portion of the coil-shaped antenna. This apparatus may fail with a high possibility by the discharge between the antenna and a conductive structure nearby. In order to prevent this discharge, an additional structure is needed to insulate the antenna from the existing structure, causing the apparatus to be complicated.

When a Faraday shield is used to reduce the partial removal of the wall, foreign matters are liable to adhere to the wall and to appear if its sticking rate to the wall from the plasma is accelerated. Therefore the partial removal of the wall must be adjusted according to the process.

The plasma density distribution is determined mainly by the generation rate distribution and by the state of transportation of ions and electrons. In the absence of an external magnetic field, the transportation of the plasma diffuses isotropically in every direction. At this time, electrons instantly escape and tend to reach the wall of the vacuum chamber because the mass is no more than 1/1,000 of that of an ion, but they are repelled by the sheath (ion sheath) formed in the vicinity of the wall. As a result, a quasi-neutral condition of the electron and ion densities is always met in the plasma, so that both the ions and electrons are bipolarly diffused toward the wall. At this time, the potential of the plasma takes on its maximum where the plasma density, i.e., the ion density, is the maximum. This potential is termed the plasma potential Vp, approximately expressed by Vp≈T≈ex ln(mi/me), where Te, mi and me are the electron temperature, the mass of an ion, and the mass of an electron, respectively. In the plasma, the potential distribution is determined by the potential Vp and the wall potential (ordinally at 0 V), so that the density distribution is correspondingly determined. Since, in this case, the plasma is confined by the electrostatic field established by itself, the density distribution is determined by the shape of the apparatus, the place where the induced electric field takes on the maximum, and the ratio of the generation rate/the bipolar diffusion flux.

When the coil is wound by several turns on the vacuum chamber, for example, the magnetic flux generated by the coil takes on the maximum at the central portion so that the induced electric field takes on the maximum at the central portion. Moreover, the induced electric field cannot penetrate deeper than about the skin depth, e.g., 1 cm, so that both the ionization factor and the dissociation factor take on their maximums at the radially central portion (in the direction of arrow r, e.g., in FIG. 21($a$)) and just below the dielectric member (in the direction of arrow z, e.g., in FIG. 21($a$)). After this, the plasma diffuses towards the wafer side (downstream side). In the case of an ordinary chamber having a cylindrical shape, therefore, the plasma density is the maximum at the central portion in the direction of arrow r, and the degree of central concentration rises downstream so that the plasma density becomes nonuniform in the region where the wafer is placed.

SUMMARY OF THE INVENTION

A first object of the invention is to control the removal extent of the vacuum chamber wall around the plasma generating portion by the plasma. A second object of the invention is to improve the plasma ignitability.

A third object is to realize a uniform plasma of high density. This object is particularly desired in processing large semiconductor wafers (e.g., large-size semiconductor wafers of 300 mm).

In order to achieve the above-specified objects, according to the invention, there is provided a plasma processing apparatus comprising an antenna (coil) for generating an electric field in a plasma generating portion, a radio-frequency power source for supplying radio-frequency electric power to said antenna, a vacuum chamber enclosing the plasma generating portion to establish a vacuum atmosphere therein, a Faraday shield provided around said plasma generating portion (e.g., around the vacuum chamber), a gas supply unit for supplying gas into said vacuum chamber, a sample stage on which an object to be processed is placed, within the vacuum chamber, and a radio-frequency power source for applying a radio-frequency electric field to said sample stage, a plasma being generated by accelerating electrons and ionizing them by collision with the electric field generated by said antenna, and thereby processing said object; characterized in that a load is provided in the earth portion of said antenna, the average potential of said antenna is adjusted so as to improve the ignitability at a plasma ignition time, and the load is adjusted after the plasma is produced so that the average potential of said antenna may be close to that of the earth, and the removed amount of the wall of said vacuum chamber after the plasma generation may be small. The above-specified objects are also achieved, according to the present invention, by a method of operation of this apparatus whereby the load provided in the earth portion of the antenna is adjusted (that is, the voltage on the ends of the antenna (coil) is controlled) such that ignitability of the plasma at the time of plasma ignition is facilitated, and is then again adjusted to be close to that of the ground to limit the amount of chamber wall removed (e.g., etched) by the plasma.

Here, the phenomenon that the average potential of the antenna comes close to that of the earth means that the potentials 30$a$ and 30$b$ of FIG. 4 are mutually opposite in phase but substantially equal to each other, that is, Va≈−Vb.

As another technique and structure to achieve the above-specified objects, the Faraday shield can be provided with at least one switch. When igniting the plasma at a plasma ignition time, the at least one switch is positioned such that the Faraday shield is held in a floating state, to facilitate ignition of the plasma. Thereafter, the at least one switch is thrown to ground the Faraday shield, so as to protect the wall of the plasma chamber from removal by the plasma.

As still another technique and structure to achieve the above-specified objects, the load can be provided in the earth portion of the antenna and a switch or switches can be provided for the Faraday shield. By adjusting the load and positioning the switch as described in the preceding paragraphs, ignition of the plasma is facilitated and removal of the wall in the plasma chamber is avoided.

Means for solving the above-specified problems will be described with reference to FIG. 2. FIG. 2 shows an experimental induction type plasma generating apparatus, used for verifying the present invention. With this apparatus, the methods for reducing the partial removal of the vacuum chamber wall around the plasma generating portion by the plasma and for improving the ignitability of the plasma are examined by changing the way of grounding the Faraday shield and the antenna to the earth.

In this apparatus, a mixed gas of a chlorine gas and a boron trichloride gas is supplied into a vacuum chamber 2 made of alumina, by the gas supply unit 4. The gas is ionized to produce a plasma 6 with the electric field which is generated by a coil-shaped antenna 1 of two turns wound around the vacuum chamber 2. After this plasma production, the gas is discharged to the outside of the vacuum chamber by a discharge unit 7. The electric field for producing the plasma is generated by feeding the antenna 1 with radio-frequency electric power of 13.56 MHz generated by a radio-frequency power source 10. In order to suppress the reflection of the electric power, an impedance matching unit 3 is used to match the impedance of the antenna 1 with the output impedance of the radio-frequency power source 10. The impedance matching unit is one using two capacitors of variable capacitance, generally called an "inverted L type". The other end of the antenna is grounded through a capacitor 9 to the earth, and a switch 21 is provided for shorting the capacitor 9. In order to prevent the vacuum chamber 2 from being etched by the plasma 6, moreover, a Faraday shield 8 is interposed between the antenna 1 and the vacuum chamber 2. By turning on/off a plurality of switches 22, the Faraday shield can be brought into either the grounded state or the ungrounded state. FIG. 3 is a perspective view showing the state that the Faraday shield is installed. This Faraday shield 8 is provided with a slit 14 for transmitting the inductive electric field 15a generated by the coil-shaped antenna 1, into the vacuum chamber but intercepting a capacitive electric field 15b. The plasma is ignited mainly with the capacitive electric field 15b. When the Faraday shield is grounded to the earth, however, the capacitive electric field from the antenna is hardly transmitted into the vacuum chamber, thereby deteriorating the ignitability of the plasma. When the Faraday shield is not grounded to the earth, the antenna and the Faraday shield are capacitively coupled to bring the potential of the Faraday shield close to the average potential of the antenna. Thus, it is considered that the capacitive electric field is established between the Faraday shield 8 and an electrode 5, and hence the ignitability of the plasma is not deteriorated so much.

The capacitive electric field 15b is normal to the wall of the vacuum chamber 2, so that the charged particles in the plasma are accelerated to impinge upon and damage the wall. Light 16 emitted from the plasma was observed with a spectroscope 20, and the removal of the wall was measured by observing the light emission strength of aluminum in the plasma as the wall aluminum was removed.

First of all, here will be described a method for optimizing the capacitance of the capacitor 9 connected to the earth portion of the antenna in the experimental apparatus shown in FIG. 2 so that the removal of the wall may be reduced. In the following, the conduction state between the two ends of the switch will be referred to as "on", and the cut-off state will be referred to as "off". With the switch 21 being off, that is, with the capacitor 9 being not shorted, here will be described the optimum value of the magnitude of the capacitance of the capacitor 9. The experimental apparatus of FIG. 2 can be shown as an equivalent circuit in FIG. 4. Then, the antenna 1 acts as the primary coil of a transformer, and the plasma 6 acts as the secondary coil of the same. The antenna 1 and the plasma 6 are coupled capacitively, and their capacitance is shown by capacitors 31a and 31b. The capacitance C of the capacitor 9 is determined so that a relation of Va=−Vb always holds between the potential Va at the position of the point 30a on the circuit and the potential Vb at the position of the point 30b when the antenna has an inductance L. When this condition is satisfied, the potentials to be applied to the two ends of the capacitors 31a and 31b are minimized, minimizing the wall damage. FIG. 5 further simplifies the circuit of FIG. 4, namely the antenna and the plasma are combined together as an element 17 having one combined impedance. The impedance of the element was experimentally determined to be Z1=2.4+141j(Ω), where j is a complex number. This measurement of the impedance can be simply executed by measuring the electric current flowing through an object to be measured, and the voltages at the two ends of the object. The capacitor 9 has an impedance Z2=−(1−ωC)j, where ω is the angular frequency corresponding to 13.56 MHz. For Va=−Vb, the relation between the impedances Z1, Z2 is (Z1+Z2):Z2=1:−1 since the real part of Z1 is so small that it can be ignored. The calculated electric capacitance of the capacitor 9 is about 150 pF, therefore, the relation Va=−Vb holds. FIG. 6 illustrates the results of calculation of the amplitudes of the potentials at the point 30a (the dotted curve) and the point 30b (the solid curve). The graph shows the capacitance of the capacitor 9 as the abscissa, and the amplitudes of the generated potentials as the ordinates. As a result, the generated potentials were mutually equal in the vicinity of the capacitance of 150 pF of the capacitor 9, the phases of the oscillating voltages at that time were shifted by 180 degrees, and the relation of Va=−Vb was satisfied. This makes it possible to determine by the method thus far described such a capacitance of the capacitor to be connected to the earth side of the antenna that the damage of the wall is minimized.

Next, with the capacitance of the capacitor 9 fixed at 150 pF in FIG. 2, the removed amount of the wall and the plasma ignitability were examined, as tabulated in FIG. 15, when the switches 21 and 22 are turned on or off. The wall removal is found to be great when the switch 21 is on and the switch 22 is off. Under this condition, the plasma ignitability is excellent. Under the other conditions, however, the wall removal can be reduced, but the plasma ignitability is low. Therefore, it has been found that the condition for little wall removal and for excellent plasma ignitability is not present in this system. However, these two purposes can be achieved by operating either the switch 21 or the switch 22 so as to reduce the wall damage after the plasma was ignited under the condition that the switch 21 is on and the switch 22 is off at the ignition time. Here, it is better to use only the switch 21 for the simplification of the apparatus structure. This is partly because the potential of the Faraday shield has to be lowered to zero as much as possible so as to reduce the wall damage by using the switch 22, and consequently the switch 22 has to be provided in plurality, and partly because the Faraday shield has to be grounded with the shortest distance to the earth so that the plural switches 22 have to be provided just near the antenna and the Faraday shield. If the plural switches are arranged for those necessities at the portion adjacent to the antenna and the Faraday shield, the result is a complicated structure. This complicated structure can be avoided with respect to the switch 21 because only one switch 21 is connected to the capacitor 9 side which is provided at a considerable distance from the antenna.

The off state of the switch 21 is the state that the capacitor of 150 pF is connected between the antenna and the earth, and the on state of the switch 21 is identical to the state that the capacitance of the capacitor 9 is increased to infinity in a radio-frequency band of HF or VHF. This means that the wall removal increases more as the capacitance of the capacitor 9 is raised to a higher level from 150 pF. The wall removal also increases even if the capacitance of the capacitor 9 is lowered from 150 pF. Thus, the wall removal can be controlled by varying the capacitance of the capacitor 9.

In an apparatus shown in FIG. 7, the capacitance of the capacitor 9 connected to the earth side of the antenna 1 is variable, so that the wall removal by the plasma can be reduced by varying the capacitance of the capacitor 9. Moreover, the plasma ignitability can be drastically improved by making the capacitance of the capacitor 9 far larger or smaller than 150 pF at the time of igniting the plasma.

By adjusting the capacitance of the capacitor connected to the earth side of the antenna, as described above, the removed amount of the wall by the plasma can be reduced to achieve the first object of the invention. At the plasma ignition time, moreover, the capacitance of the capacitor connected to the earth side of the antenna can be changed to establish an excellent ignitable state, thereby achieving the second object of the invention.

Here will be examined a method for generating a uniform plasma. When the coil-shaped antenna is placed on the upper face of the vacuum chamber, the induced electric field is generated at the central portion, even if the diameter of the antenna is varied to vary the intensity of the induced electric field in the radial direction, so that the plasma density distribution is nonuniformly concentrated at the center. This tendency of concentration of the plasma density at the center is not varied even if a plurality of antennas are arranged to vary the distance between each antenna and the dielectric member. FIG. 21(b) illustrates one example of the calculation of the plasma density distribution when the antenna is placed on the vacuum chamber like FIG. 21(a). From this calculation, when the ratio of the apparatus height H to the radius R (the aspect ratio) is as large as H/R=20/25, as illustrated in FIG. 21(b), the plasma density at the place, just below the antenna (z=2 cm), where the antenna is present takes on its maximum and increases in its absolute value (z=10 cm) downstream (in the direction where the value z increases) but is small just above the substrate. It is then found that the plasma density is nonuniform. When viewed in the z direction, the density takes on its maximum at the apparatus center z=10 cm. When the aspect ratio is reduced, as illustrated in FIG. 21(c), the density distribution is substantially identical to that of FIG. 21(b), but the distribution just above the substrate is gentler than that of (b) and is concentrated at the center.

The plasma density distribution is determined by the boundary condition that the plasma density is zero on the vacuum chamber wall and by the generation rate distribution, i.e., the antenna position. Even if the antenna position is changed, as illustrated in FIG. 21(d), and if a plurality of antennas are placed to change the power distribution, the shape of the density distribution remains unchanged. When the coil is provided on the upper face, the induced electric field generated by the antenna takes on its maximum just below the antenna, so that a centrally concentrated distribution is always established on the downstream.

In the case of an arrangement in which the antenna is wound horizontally around the vacuum chamber, the induced electric field takes on its maximum on the side face of the chamber. A sheath is formed on the side face of the chamber, so that the plasma density takes on its maximum slightly inside the sheath, at the place the closest to the antenna. As shown in a horizontal section at this time, the potential is higher at the sheath end than at the wall and than at the plasma center so that the plasma is transported to the two sides from the sheath. Simultaneously with this, the plasma flows downstream from that position, and hence the density distribution is uniform in a portion in a horizontal section, at a distance in the z direction from the highest density portion. In the case of a cylindrical apparatus, for example, a concave distribution may be established in the vicinity of the wafer for a small H/R ratio, and a convex distribution may be established for a sufficiently large H/R ratio where H is the height of the apparatus and R is the radius thereof, so that the plasma density distribution can be controlled to some extent (refer to FIGS. 22(a) and 22(b)). The dominant factors at this time are the shape of the apparatus, i.e., the ratio H/R. When the antenna is provided on the side face, however, the plasma density is lowered by the reduction in the coupling efficiency due to the large coupling area of the antenna and the plasma and by the large loss of the plasma because the region where the density is a maximum is near to the side face wall. If the supplied power and the vacuum chamber size are the same, the plasma density of this case is lower than that of the aforementioned case in which the antenna is provided on the upper face. This raises a problem that the processing speed of the object to be processed is low.

As thus far described, the plasma density distribution of the inductively coupled plasma varies with the apparatus shape and the antenna arrangement, but the third object of the invention is achieved by such a construction where the upper face of the vacuum chamber has a smaller area than that of the lower face, and the upper face is flat. Thus, the apparatus of the present invention can be used to process large-sized semiconductor wafers discussed previously.

In the plasma processing apparatus, preferably, the angle between the edge at which the lower face and the upper face intersect and the normal of the upper face is not less than 5 degrees.

In the plasma processing apparatus, more preferably, the ratio of the apparatus height (the distance from the object to be processed to the upper face) to the lower surface radius Rd is not more than 1.

BRIEF DESCRIPTION OF THE DRAWINGS

FIG. 15 shows a table indicating the switches 21 and 22, the removed amount of the wall of a vacuum chamber and RF powers necessary to ignite a plasma.

DETAILED DESCRIPTION OF PREFERRED EMBODIMENTS

Embodiments of the present invention will be described in the following. These embodiments are only illustrative of the present invention, the present invention being defined by the appended claims.

Figure 1:
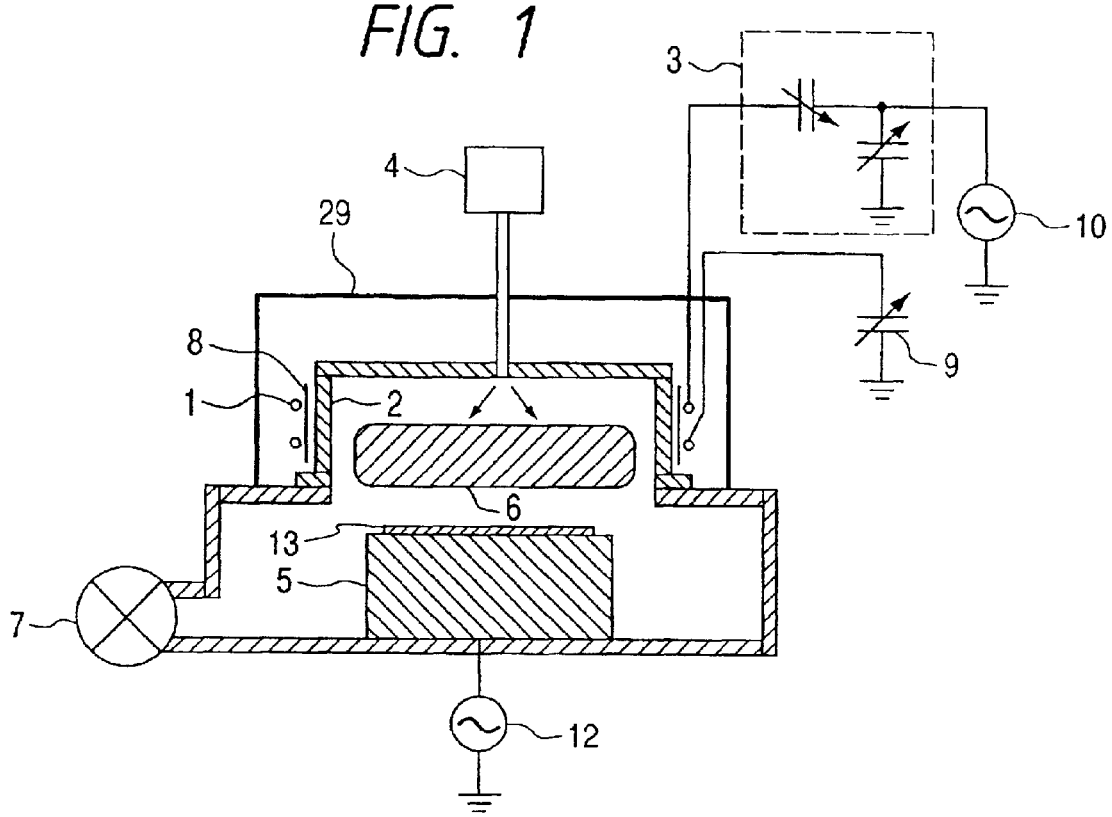
FIG. 1 shows a structure of a first embodiment of the invention.
Figure 2:
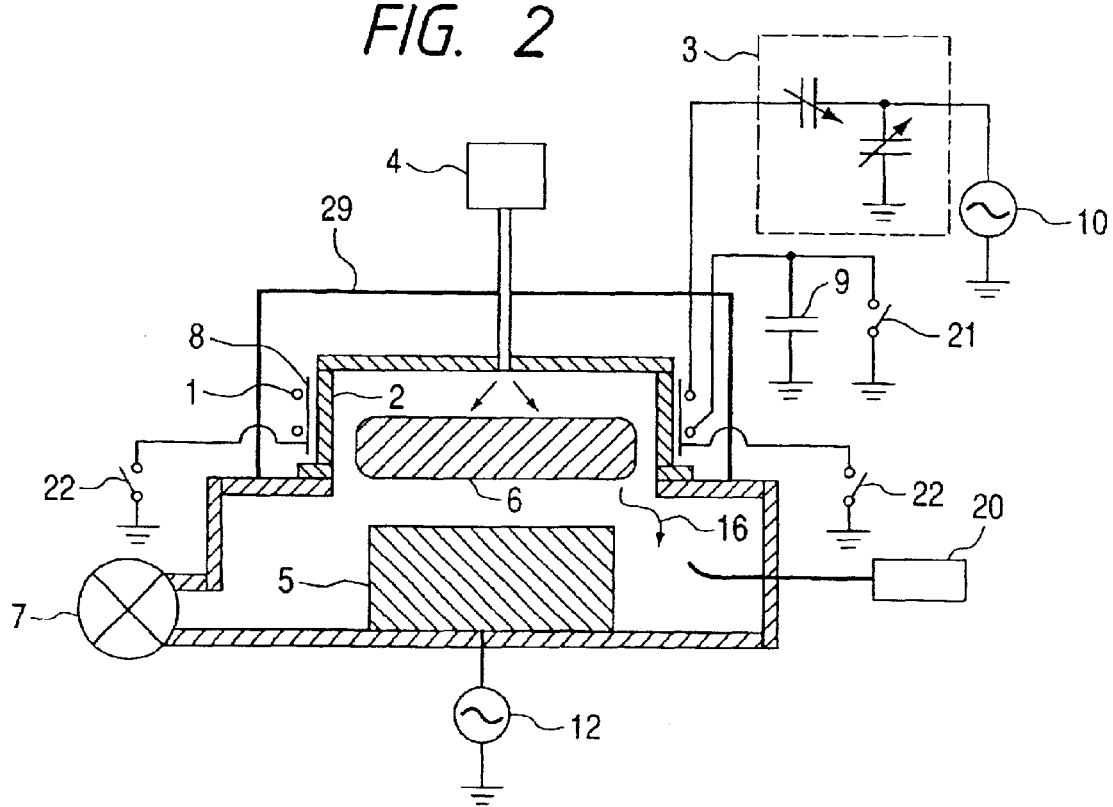
FIG. 2 shows a structure of an experimental system used for verifying the invention.
Figure 3:
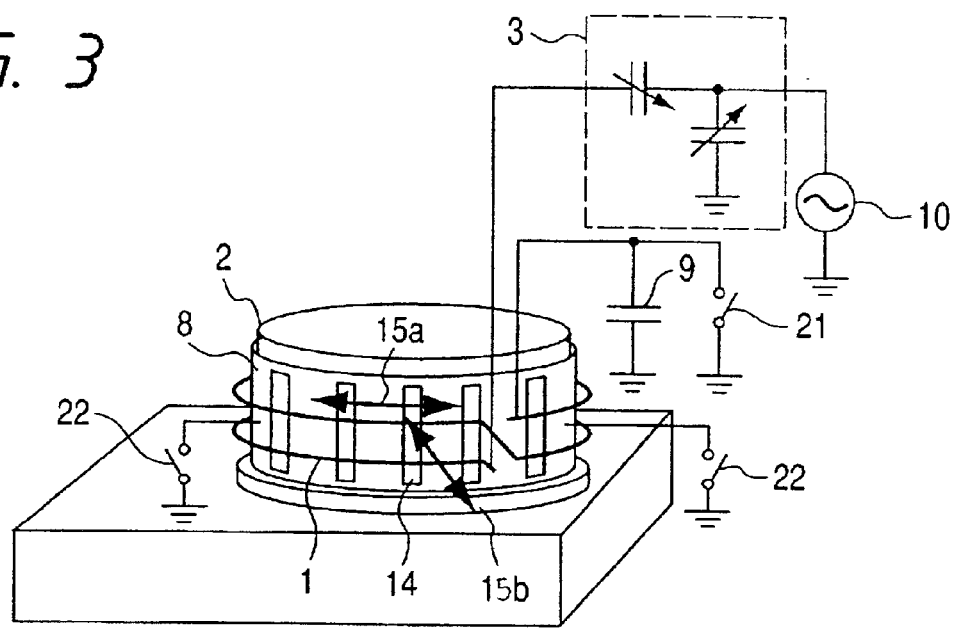
FIG. 3 shows the state that a Faraday shield is mounted.
Figure 4:
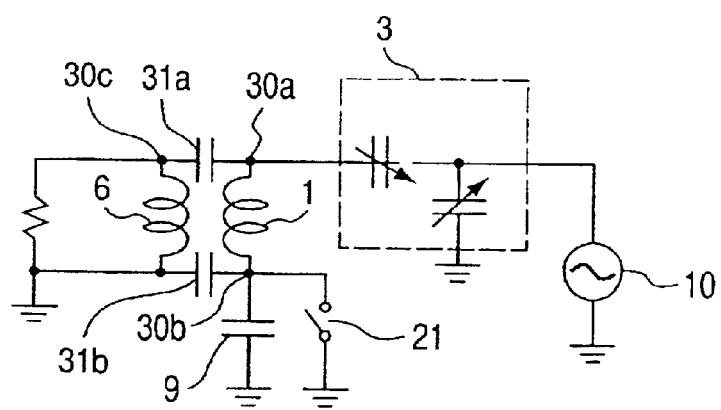
FIG. 4 shows an equivalent circuit diagram of the experimental system used for verifying the invention.
Figure 5:
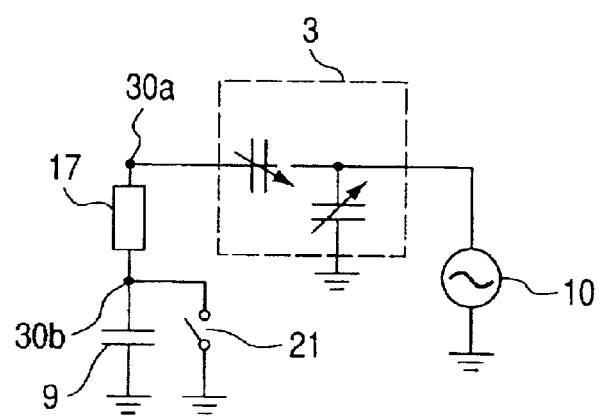
FIG. 5 shows an equivalent circuit diagram of an experimental system used for verifying the invention.
Figure 6:
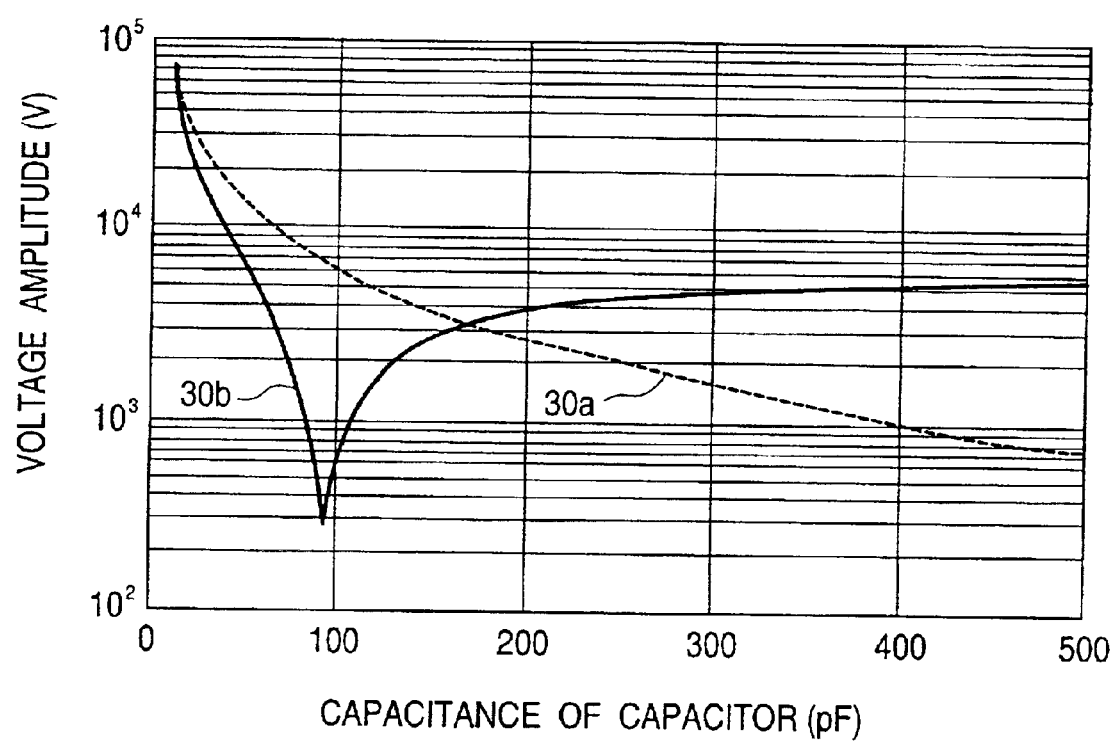
FIG. 6 shows a graph illustrating the amplitude of a potential established between the two ends of an antenna.
Figure 7:
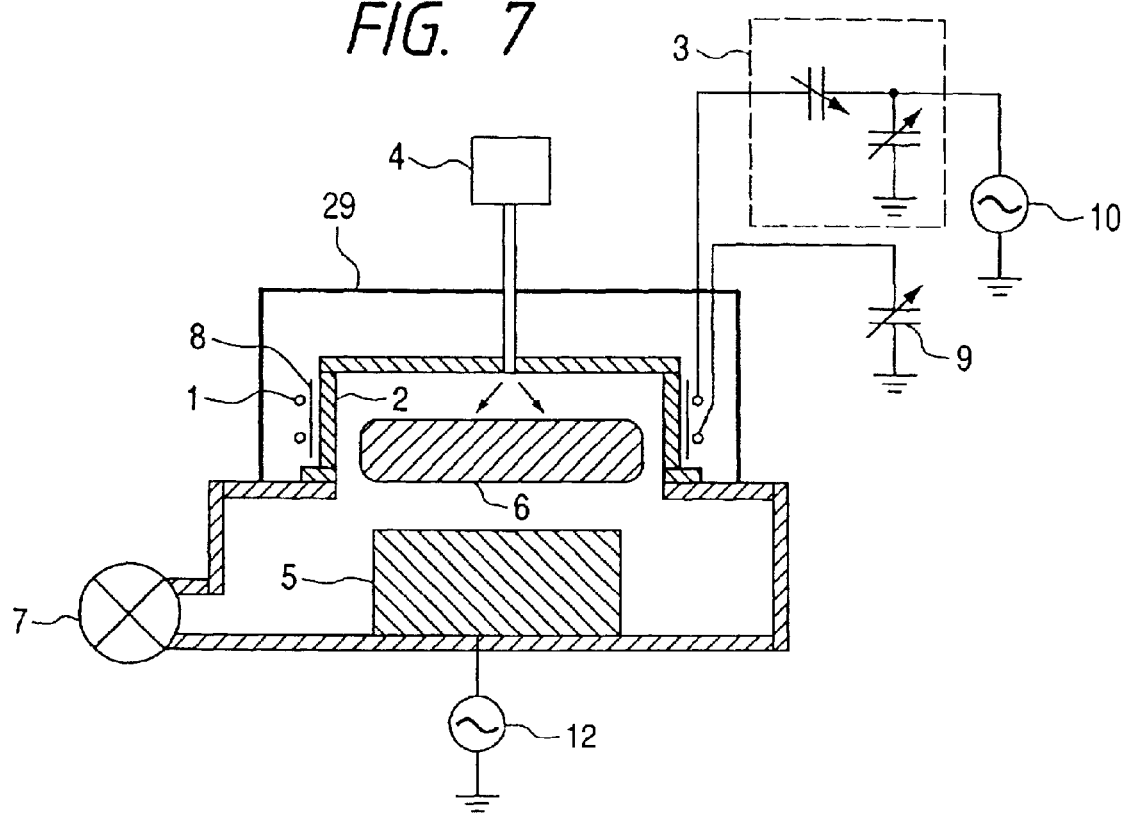
FIG. 7 shows a diagram of an experimental system used for verifying the invention.

FIG. 1 shows a first embodiment of the semiconductor processing apparatus according to the present invention. In the present apparatus, a material gas of, e.g., oxygen, chlorine, boron trichloride or the like to be used for processing a semiconductor is supplied into a vacuum chamber by a gas supply unit 4 and is ionized to generate a plasma 6 with the electric field which is generated by a coil-shaped antenna 1. After this plasma generation, the gas is discharged to the outside of the vacuum chamber by a discharge unit 7. The plasma generating electric field is generated by supplying the antenna 1 with radio-frequency electric power which is generated by a radio-frequency power source 10 of 13.56 MHz, 27.12 MHz, 40.68 MHz or the like. In order to suppress the reflection of the electric power, however, an impedance matching unit 3 is employed to match the impedance of the antenna 1 with the output impedance of the radio-frequency power source 10. The impedance matching unit is of a so-called inverted L type. Depending on the frequency or the structure of the antenna, however, it is necessary to employ an impedance matching unit by which matching is easy. The other end of the antenna 1 is grounded to the earth through a capacitor 9 having a variable capacitance. Between the antenna 1 and the vacuum chamber 2, there is interposed a Faraday shield 8 for preventing the vacuum chamber 2 from being adversely etched by the plasma 6. The Faraday shield is not electrically grounded. As shown in FIG. 3, moreover, the Faraday shield 8 has a slit perpendicular to the direction in which the coil of the antenna is wound. A semiconductor wafer 13 to be processed is placed on an electrode 5. In order to attract ions existing in the plasma to the space above the wafer 13, an oscillatory voltage is applied to the electrode 5 by a radio-frequency power source 12. It is important that the capacitance of the variable capacitor 9 be a value at which the partial removal of the wall is minimized.

Reference numeral 29 indicates a thermostatic chamber of constant temperature. In FIG. 1, there is a fan and/or heater within the chamber 29, and the thermostatic chamber controls the temperature of the vacuum chamber 2.

In the present embodiment, at the time of igniting the plasma 6, the capacitance of the capacitor 9 is adjusted to a value larger or smaller than that which minimizes the wall removal. The capacitance is adjusted to about two times or one half as large as the value which minimizes the wall removal, so that the plasma can be ignited with the radio-frequency power of several tens of watts.

After this plasma ignition, the capacitance of the capacitor 9 is brought closer to the value minimizing the damage so that the scraping of the wall may be minimized. When the wall should be partly removed to some extent from the standpoint of a foreign substance, the capacitance of the capacitor 9 is determined to be a value to cause desired removal. The optimum value has to be determined by repeating the semiconductor process.

Figure 8:
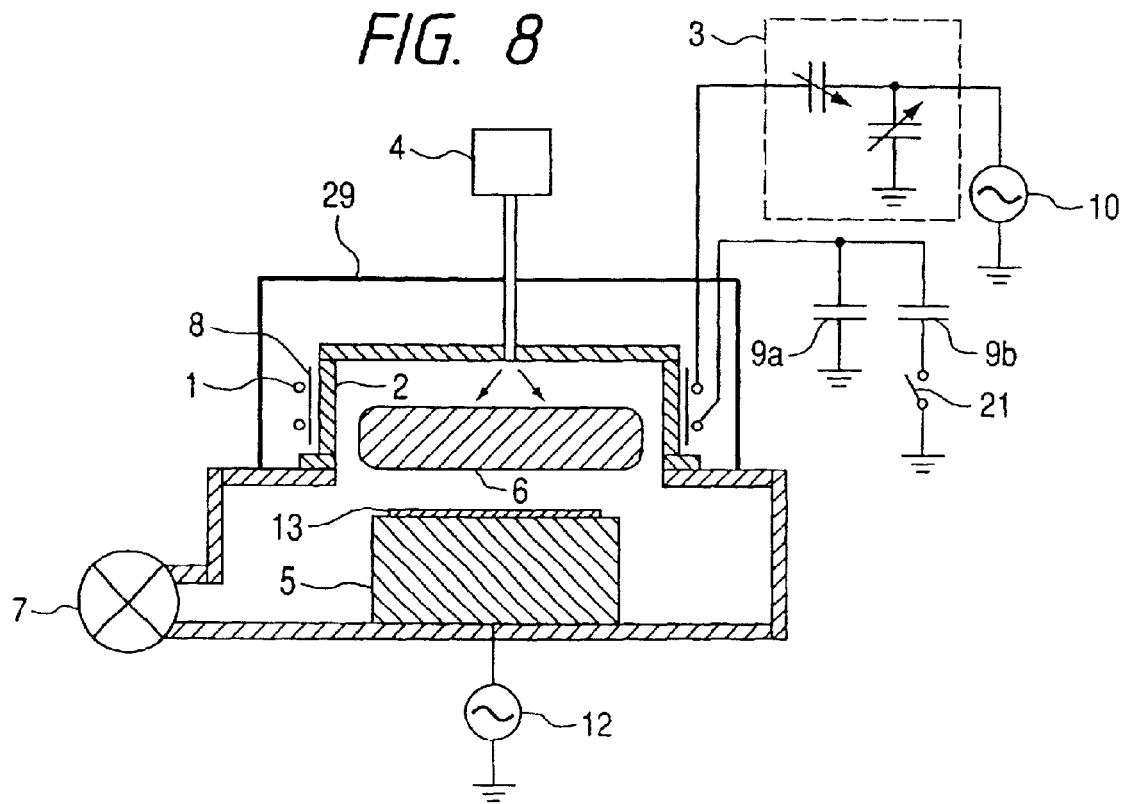
FIG. 8 shows a structure of a second embodiment of the invention.

A second embodiment of the invention will be described with reference to FIG. 8. The basic construction of the apparatus of the present embodiment is identical to that of the first embodiment, but what is different from the first embodiment is the structure of the capacitor provided at the earth side of the antenna 1. In the present embodiment, two capacitors, a capacitor 9a and a capacitor 9b, are connected in parallel with the earth side of the antenna 1. Of these, the capacitor 9a is connected directly to the earth whereas the capacitor 9b is connected through a switch 21 to the earth.

When the capacitance of the capacitor 9a is adjusted to the value to minimize the damage, the capacitance provided to the earth side of the antenna 1 is increased by the amount corresponding to the capacitance of the capacitor 9b by turning on the switch 21 at the time of igniting the plasma, so that the plasma ignitability is improved by making the capacitance of the capacitor 9b sufficiently high. After the plasma ignition, the switch 21 is turned off to minimize the removal of the wall. If the removal is desired to some extent from the standpoint of foreign substance, as in the first embodiment, the capacitance of the capacitor 9a may be adjusted to a value for the desired wall plasma-etching.

Figure 9:
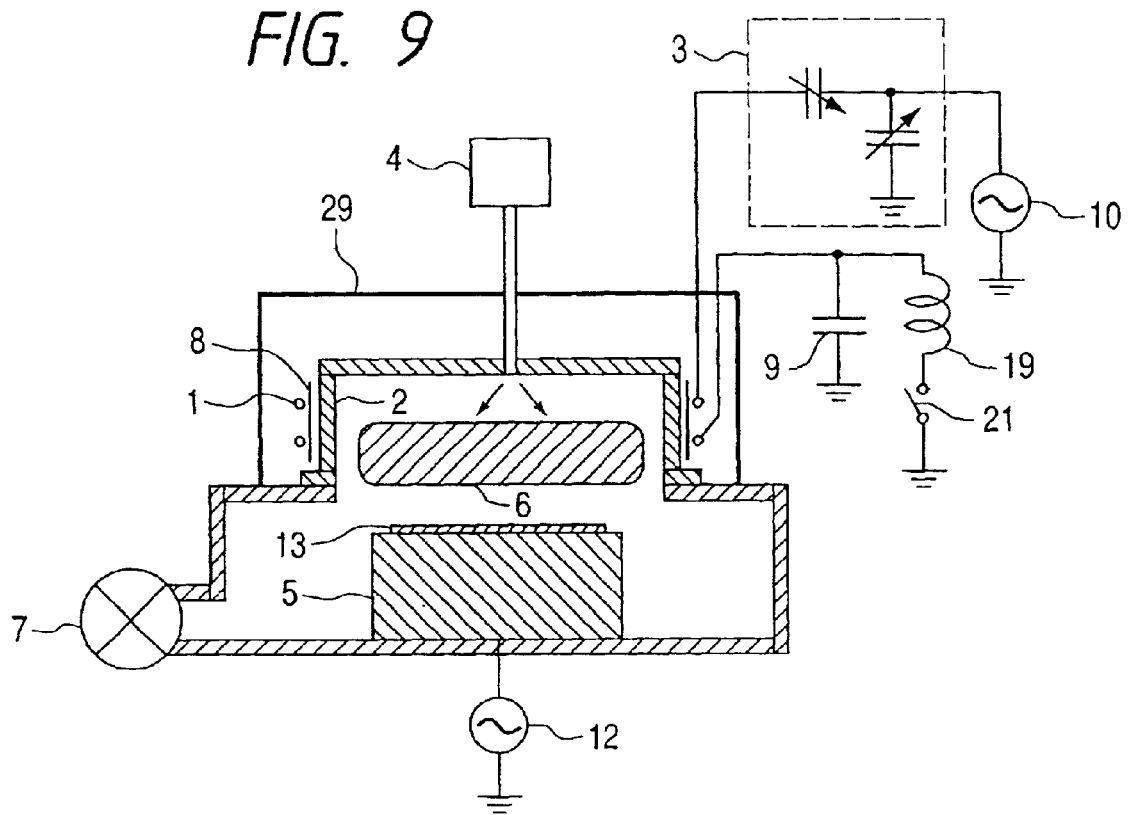
FIG. 9 shows a structure of a third embodiment of the invention.

A third embodiment of the invention will be described with reference to FIG. 9. The basic construction of the apparatus of the present embodiment is identical to that of the second embodiment, but what is different from the second embodiment is the employment of an inductor 19 in place of the capacitor of FIG. 8. When the capacitor 9 has an capacitance C, the inductor 19 has an inductance L and the radio-frequency power source 10 outputs radio-frequency waves having an angular frequency $\omega$, the impedance Z between the earth side of the antenna and the earth is expressed by $Z=-(1/\omega C)j$, when the switch 21 is off, and by $Z=-(1/(\omega C-1/\omega L))j$ when the switch 21 is on. When the capacitance of the capacitor 9 is adjusted to minimize the wall removal, with the switch 21 off, the value Z can be changed by operating the switch 21 to improve the ignitability of the plasma. At the time of igniting the plasma, therefore, the switch 21 is turned on to ignite the plasma. After the plasma ignition, the switch 21 is turned off to minimize the wall damage. If the wall should be partly removed to some extent from the standpoint of foreign matter, the capacitor 9 may be set to the value for the desired wall scraping.

In the third embodiment, there has been described a method of varying the impedance of the load connected between the antenna and the earth, by combining the capacitor, the inductor and the switch. By using means other than that of this embodiment for varying the value of the impedance of the load, it is possible to establish a state that an excellent plasma ignitability is achieved and a state that a smaller wall removal is achieved.

Figure 10:
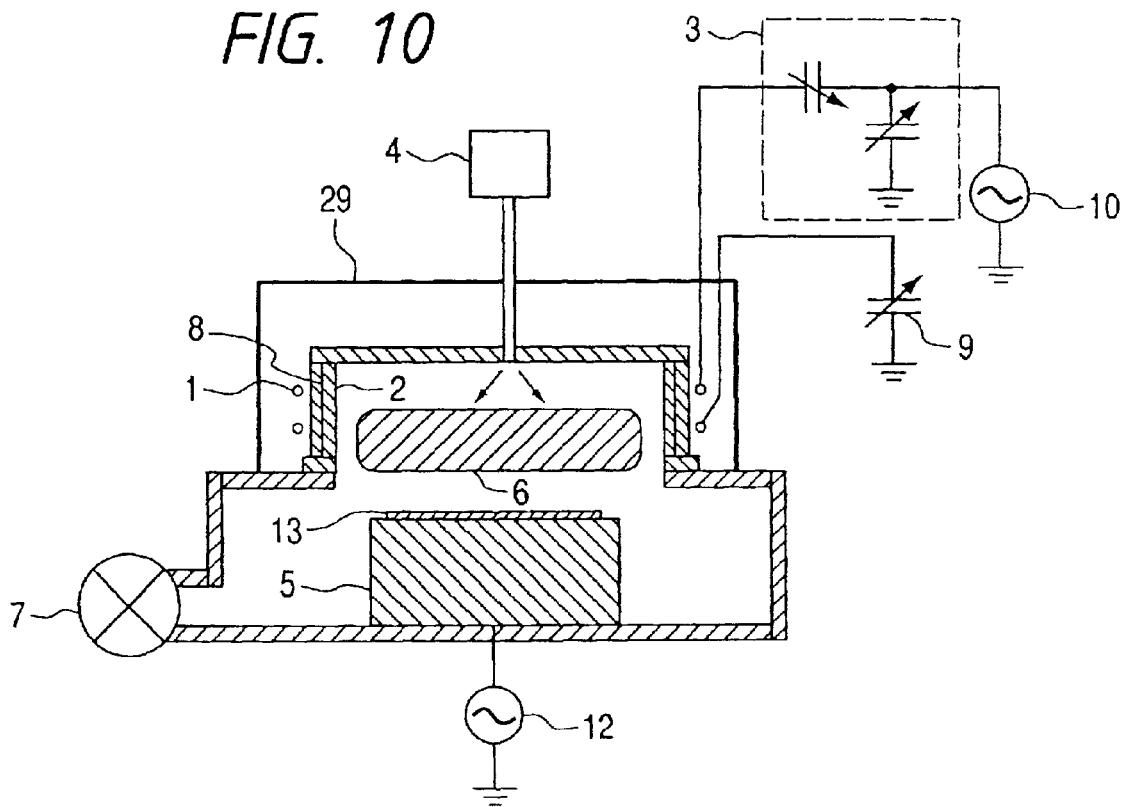
FIG. 10 shows a fourth embodiment of the invention.

A fourth embodiment of the invention will be described with reference to FIG. 10. The basic construction of the apparatus of the present embodiment is identical to those of the first, second and third embodiments, but the difference of the present embodiment is that the Faraday shield 8 made of a conductive material is buried in the wall of the vacuum chamber 2 made of a non-conductive material. As the material for the vacuum chamber 2, there is used alumina or glass. Since a metal such as chromium or aluminum can be easily fused to the alumina, a pattern thereof can be formed in the aluminum. When glass is used, a metal foil can be buried in the glass as in the defrosting heater of an automobile.

The advantages as obtained from the structure in which the Faraday shield 8 is buried in the wall of the vacuum chamber 2, are that the insulating structure can be eliminated from between the antenna and the Faraday shield 8, and that the distance between the vacuum chamber 2 and the antenna 1 can be reduced to make the apparatus compact.

Figure 11:
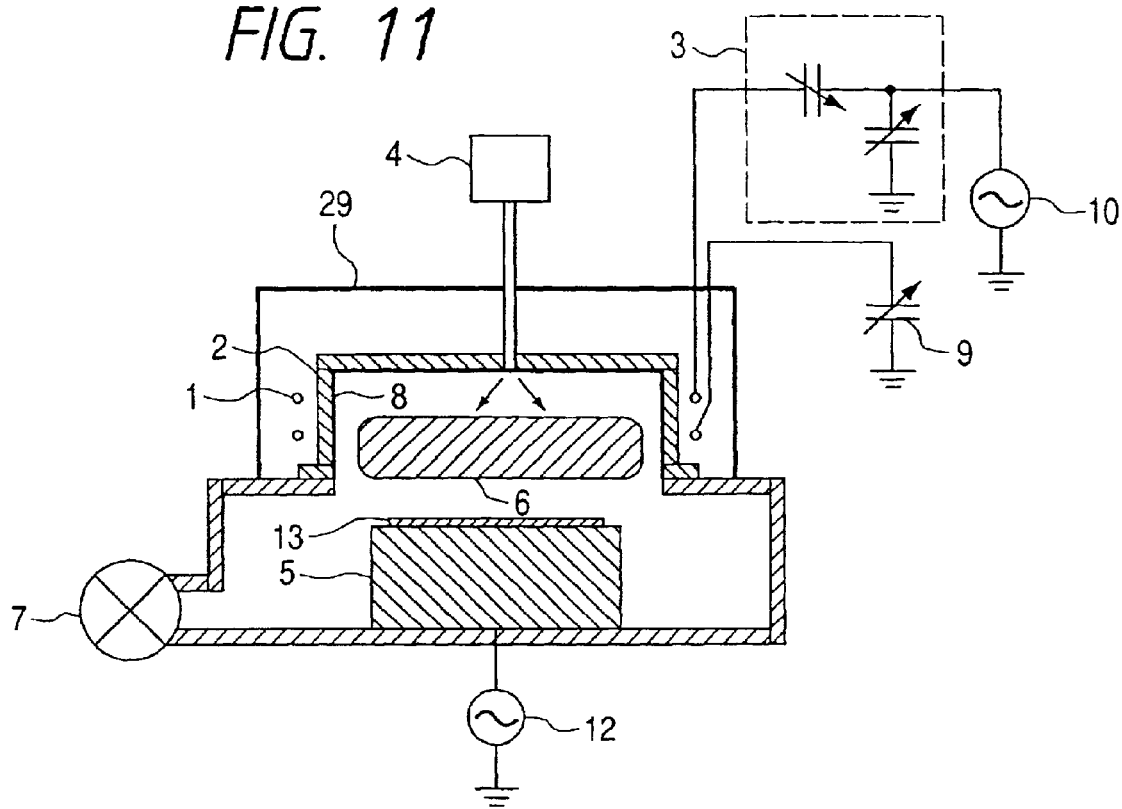
FIG. 11 shows a structure of a fifth embodiment of the invention.

A fifth embodiment of the invention will be described with reference to FIG. 11. The basic construction of the apparatus of the present embodiment is identical to that of the fourth embodiment, but the difference of the present embodiment is that a wall surface of the vacuum chamber 2 made of a non-conductive material is covered with a film made of a conductive material and acting as the Faraday shield. In the present embodiment, as an example, the internal side of the vacuum chamber on the plasma side is coated with the conductive Faraday shield 8, but similar effects can be attained even when the atmospheric side of the vacuum chamber is coated with the Faraday shield 8.

In the present embodiment, the plasma 6 comes in direct contact with the Faraday shield 8, and therefore the wall of the vacuum chamber 2 is partly removed by the plasma 6 at the slit portions of the Faraday shield 8. In an oxide film etching process using oxygen as the material gas, although depending upon the process, excellent fusibility between alumina and aluminum is utilized, realizing a construction in which an insulating material is coated with a conductive material, by using a Faraday shield 8 of conductive aluminum and a vacuum chamber 2 of insulating aluminum (e.g., alumina). In the case of the metal process in which the material gas is chlorine or boron trichloride, the purpose can be achieved by adopting alumina as the insulating material and SiC as the conductive material. Many other combinations can be conceived, and similar effects can be expected from any combination if the combination brings about such performances that the coating conductive material is hardly removed even if the temperature of the vacuum chamber rises, and that both the insulating material and the conductive material are hardly removed by the plasma.

Figure 12:
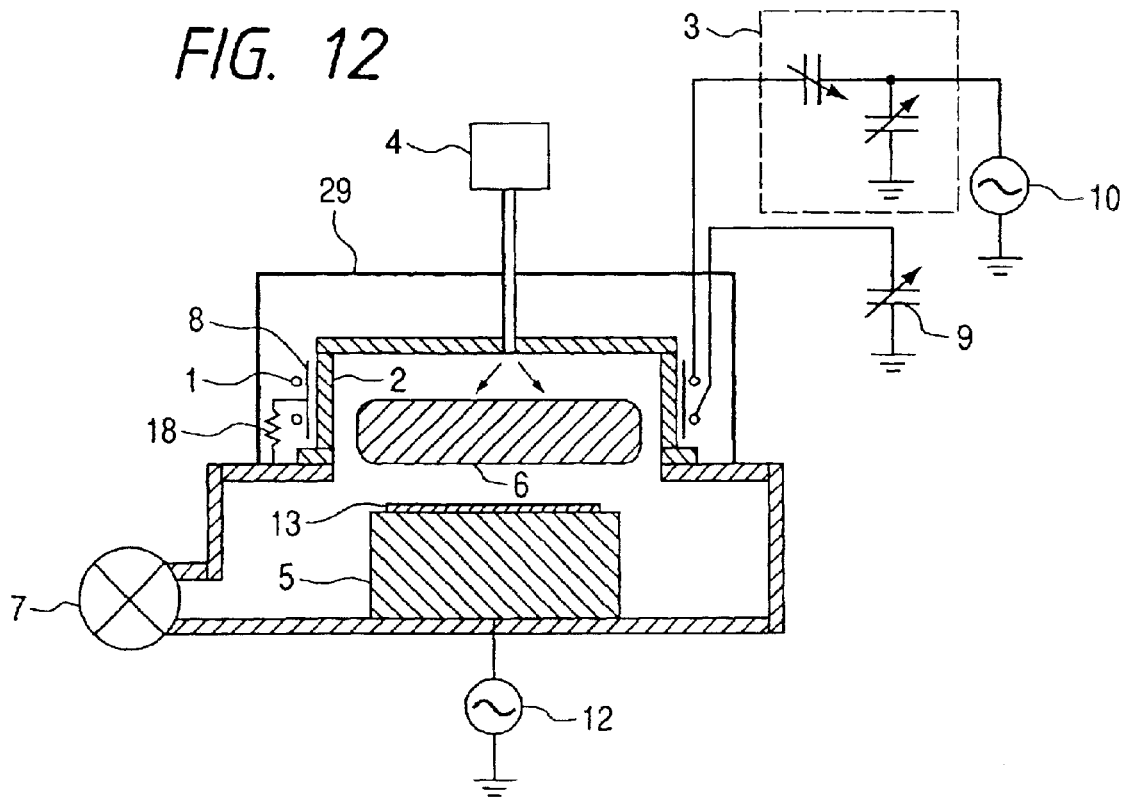
FIG. 12 shows a structure of a sixth embodiment of the invention.

A sixth embodiment of the invention will be described with reference to FIG. 12. The basic construction of the apparatus of the present embodiment is identical to those of the first, second and third embodiments, but what is different from those embodiments is that the Faraday shield 8 is grounded to the earth through a resistor 18.

It is expected that a worker may frequently touch the Faraday shield 8 at the time of reassembling the apparatus. A mechanism is required for preventing the Faraday shield from being charged at that time. In the present embodiment, a resistor 18 is used to ground the Faraday shield to the earth. The resistance of this resistor 18 has to be a higher impedance than that of the capacitance between the Faraday shield 8 and the earth, at the frequency of the radio-frequency power source 10 for generating the plasma. For this necessity, if the grounded resistor 18 has a resistance R and if the radio-frequency waves to be outputted by the radio-frequency power source 10 have an angular frequency $\omega$, the resistance R should satisfy $R>1/\omega C$. In other words, the Faraday shield and the earth are coupled to the load to give a higher impedance than that of the capacitance between the Faraday shield and the earth, at the high frequency for generating the plasma, and the impedance of the load is low in direct current, thereby preventing the Faraday shield from being charged at the end of the operation.

Figure 13:
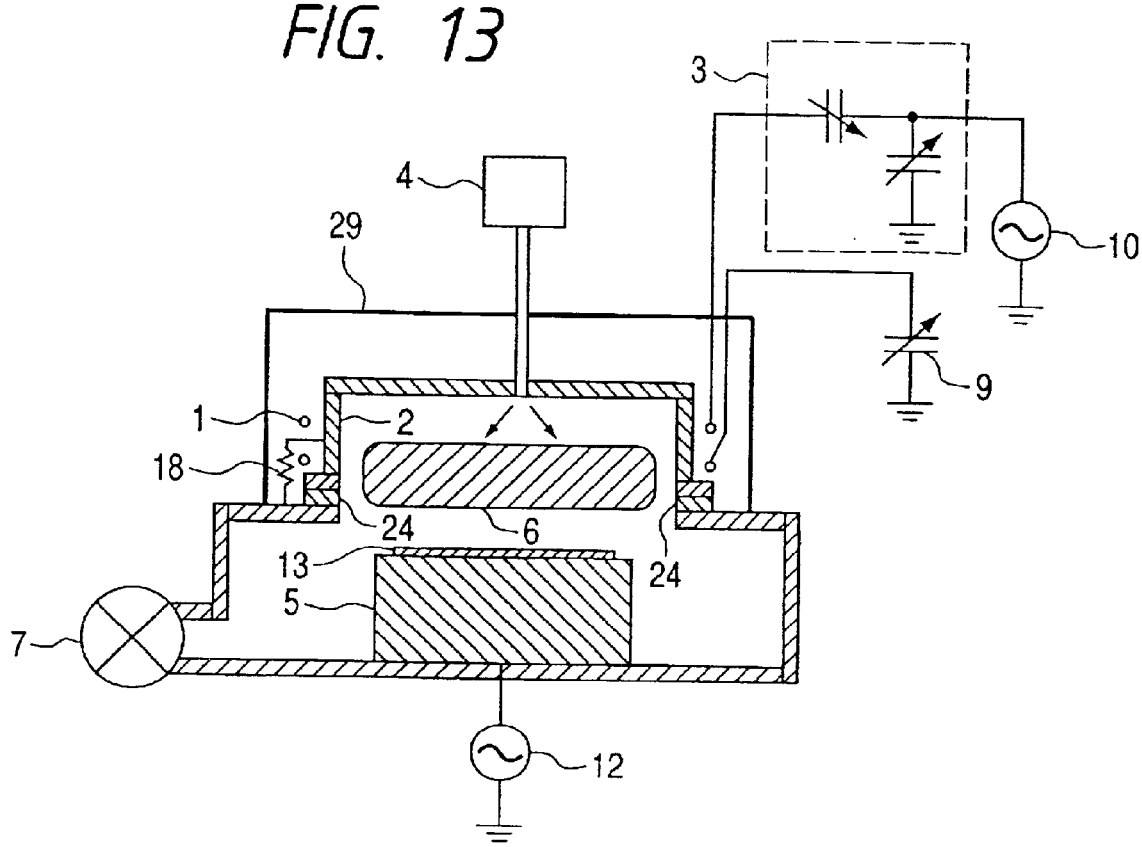
FIG. 13 shows a structure of a seventh embodiment of the invention.

A seventh embodiment of the invention will be described with reference to FIG. 13. The basic construction of the apparatus of the present embodiment is identical to that of the sixth embodiment, but what is different from the sixth embodiment is that the vacuum chamber 2 is made of a conductive material to produce the effect of the Faraday shield.

Since the vacuum chamber also acting as the Faraday shield cannot be provided with a slit to shut off the inductive electric field, as has been described with reference to FIG. 3, the inductive electric field has to be able to pass by adjusting the thickness of the wall of the conductive vacuum chamber. Here will be disclosed a structure in which the vacuum chamber is electrically floated from the earth by an insulating flange 24.

In the case of the present embodiment, no work of providing a Faraday shield around the vacuum chamber is required, improving the workability. In the present embodiment, the circuit for adjusting the average potential to a larger absolute value than that at the vicinity of the earth or of the earth itself is identical to that of the sixth embodiment.

Figure 14:
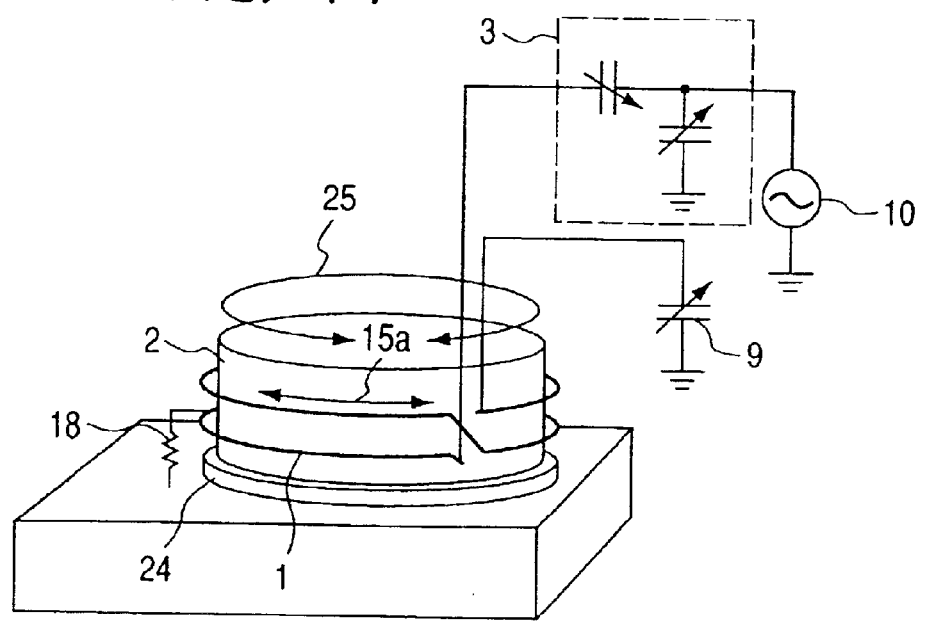
FIG. 14 shows a perspective view of a plasma processing apparatus indicating the flow of eddy current in the seventh embodiment of the invention.

FIG. 14 is a perspective view showing the behavior of eddy current flowing in the vacuum chamber in the present embodiment. The eddy current for preventing an inductive electric field 15a, as described with reference to FIG. 3, from being transmitted into the vacuum chamber 2 will flow in the circumferential direction indicated by arrow 25, of the vacuum chamber 2 having a cylindrical shape. If a relation R>ωL holds among the resistance R, the inductance L in the path of the eddy current and the angular frequency ω of the radio-frequency waves outputted from the radio-frequency power source 10, the eddy current attenuation by the resistor is increased and hence the inductive electric field is transmitted into the vacuum chamber.

The vacuum chamber 2 has to be made of such a material that it is hardly removed by the plasma, because it is directly exposed to the plasma as in the fifth embodiment. Since the vacuum chamber ordinarily has a wall as thick as about 2 cm, it may be made of a material having an electrical resistivity of about 0.02 Ωm so as to achieve such a skin thickness at a frequency of 13.56 MHz.

The vacuum chamber 2 is insulated from the earth by using the insulating flange 24 and is equipped with the charge preventing resistor 18 as in the sixth embodiment. The resistance of the resistor 18 has to be a higher impedance than that between the Faraday shield and the earth at the frequency of the radio-frequency power source 10 for generating the plasma. In the semiconductor processing, a bias voltage is applied to the electrode 5 by the radio-frequency power source 12. If the plasma is electrically floated from the earth, however, a high bias voltage is not generated between the plasma and the electrode. In order to prevent this, the plasma has to be brought as much as possible into contact with the earth thereby to lower the potential of the plasma. This lowering of the potential of the plasma can be achieved by allowing the resistance of the resistor 18 to have a lower impedance than that between the Faraday shield and the earth in the frequency band of the radio-frequency power source 12.

The present embodiment is directed to an apparatus in which the vacuum chamber is wholly made of the conductive material. Similar effects could be achieved by eliminating the slits from the Faraday shields of the foregoing embodiments and by adjusting the thickness of the conductive material as in the present embodiment.

The foregoing embodiments described comprise the vacuum chamber 2 having a cylindrical shape. Even if the vacuum chamber 2 is given an incline side face, has a trapezoidal section and is equipped with a coil and a Faraday shield, such a vacuum chamber 2 can be used in foregoing embodiments likewise.

Figure 16:
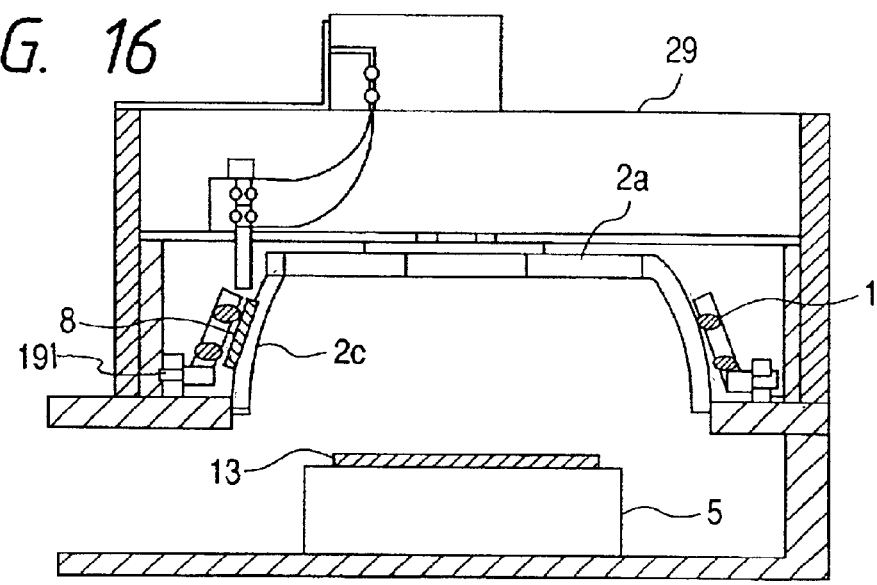
FIG. 16 shows a plasma processing apparatus of an eighth embodiment of the invention.
Figure 23A:
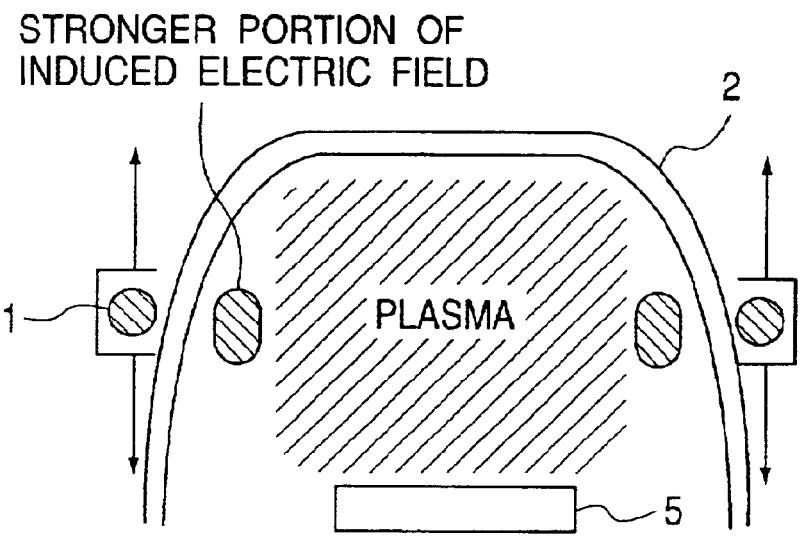
FIGS. 23(a) and 23(b) show schematic diagrams illustrating a principle of the invention.
Figure 23B:
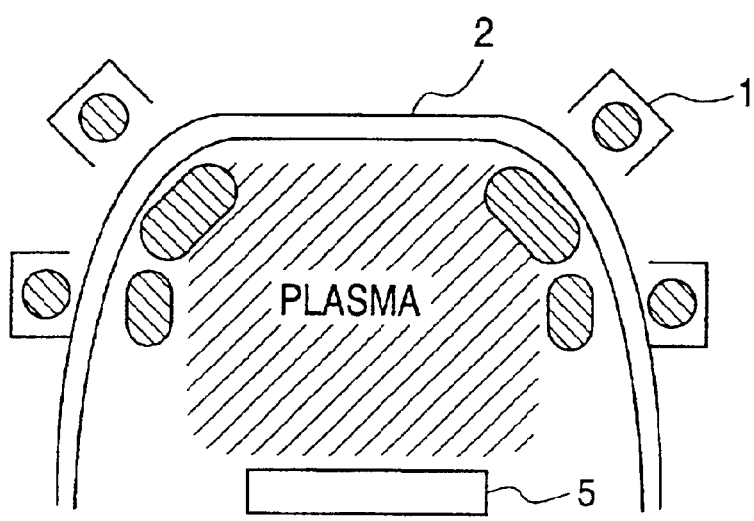

An eighth embodiment of the invention will be described with reference to FIG. 16. The basic apparatus construction of the present embodiment is identical to those of the first, second and third embodiments. What is different from the other embodiments is that the area of the upper face 2a (far from the electrode 5 for the object to be processed) of the vacuum chamber is smaller than that of the lower face. Preferably, the upper face is flat. In the invention thus constructed, the degree and position of the coupling of the plasma and the antenna can be varied according to the arrangement of the antenna, the number of turns of the antenna, the distance between the antenna and the vacuum chamber, and so on. When the number of turns of the coil of the antenna is one the antenna is installed horizontally, for example, the coupling position is varied as the antenna is moved vertically, as illustrated in FIG. 23(a). When the number of turns of the coil is more than one, the coupling state can be varied (FIG. 23(b)) according to the vertical position of the antenna and the distance between each of the turns and the vacuum chamber. The antenna may be moved upward, when the density at the central portion is increased, and downward when the density is intended to have a distribution where the density is high at the periphery. Thus, the coupling position can be varied because the apparatus shape is given a gradient by the large lower face area and the small upper face area. In the case of an inductive coupling plasma, the electrons/ions are isotropically diffused towards the chamber wall by the bipolar diffusion so that their distributions are influenced by the chamber shape. As a result, the plasma distribution is easily flattened if the upper face is flat. The control of the plasma density distribution is facilitated by the antenna arrangement and the characteristic apparatus shape. Because of the static field by the antenna 1, moreover, many foreign matters and reaction products are produced in the vicinity of the antenna by the interaction between the plasma and the vacuum chamber wall 2. Because of the large area of the lower face, however, a path is formed along the chamber wall and the discharge line 7 to allow the gas to flow easily along the wall, so that the rate of flow towards the wafer 13 to be processed can be reduced to realize a satisfactory processing.

Reference numeral 191 indicates a coil moving member. The coil moving member moves antenna (coil) 1 upward or downward to control the plasma density distribution.

Figure 17A:
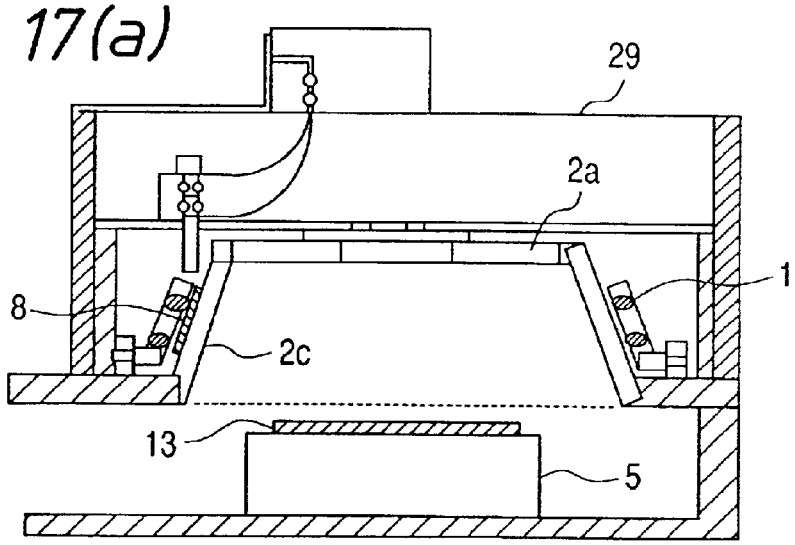
FIGS. 17(a) and 17(b) show a plasma processing apparatus of a ninth embodiment of the invention.
Figure 17B:
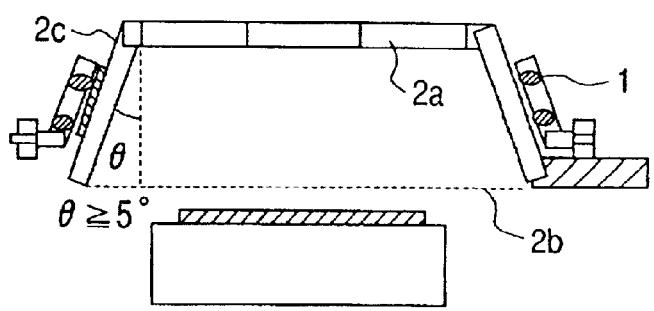
Figure 24A:
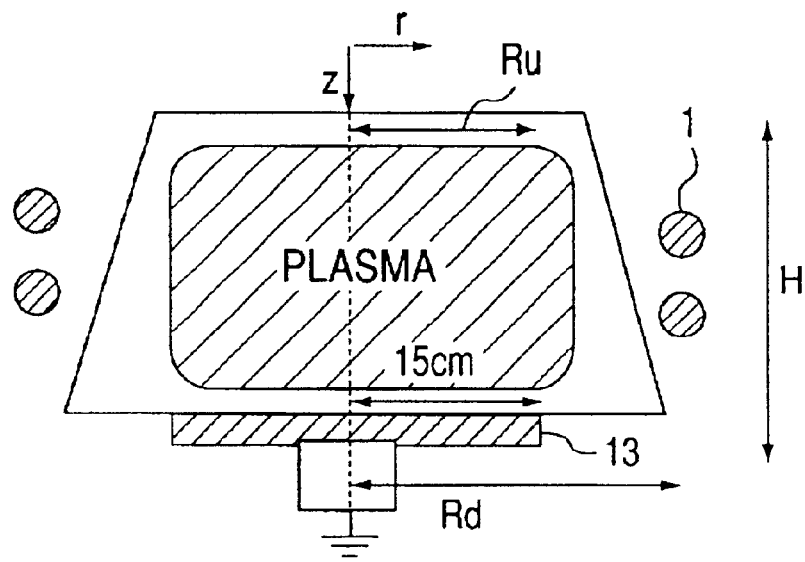
FIGS. 24(b) and 24(c) show diagrams illustrating the distribution of ion current incident on the wafer in the case of the invention, wherein the apparatus is schematically illustrated in FIG. 24(a).
Figure 24B:
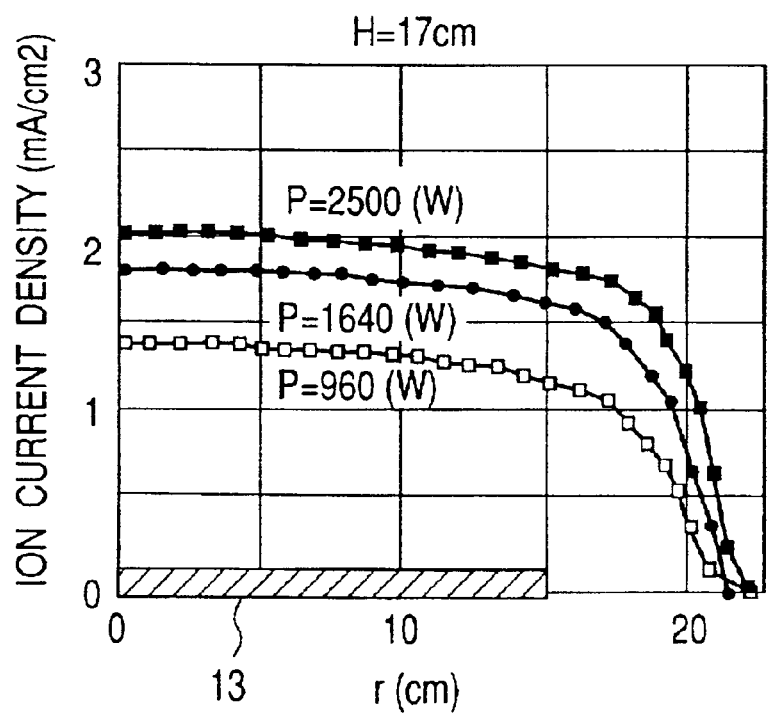
Figure 24C:
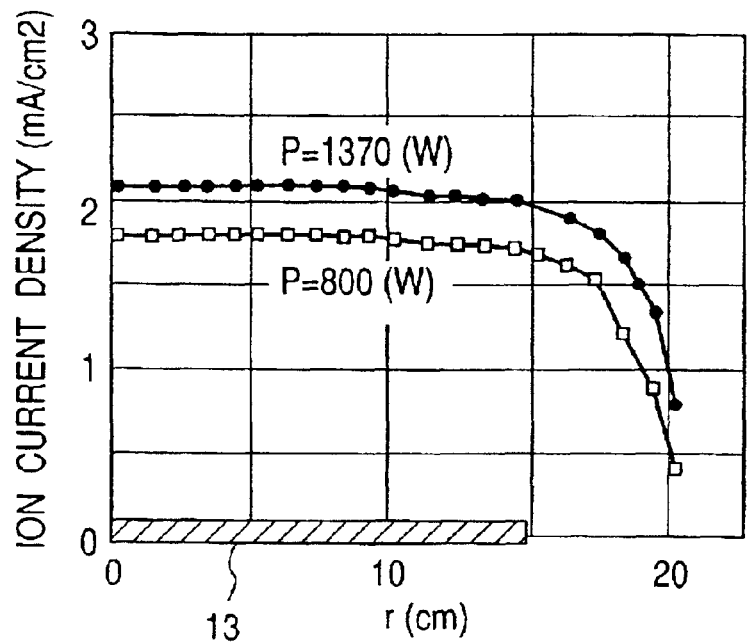

A ninth embodiment of the invention is shown in FIGS. 17(a) and 17(b). The basic apparatus construction of the present embodiment is identical to that of the eighth embodiment. What is different from the other embodiments is that the angle (see FIG. 17(b)) between the edge where the upper face 2a of the vacuum chamber 2 and the lower face 2b thereof intersect (that is, the side of the vacuum chamber 2) and the normal of the upper face is not less than 5 degrees. FIG. 24 shows the distribution of the density of the ion current incident on the surface of the object when the shape of the vacuum chamber is such that, for example, the ratio of the upper surface radius Ru to the lower surface radius Rd is 4:5. For the vacuum chamber height H=13 cm, the ion current is flat up to φ=300 (r=15 cm). If the height H is increased, the distribution is shown by a curve the center of which is rather high. It has also been confirmed that the curve is high at the periphery when the height H is decreased. If $\tan^{-1}\{(Rd-Ru)/H\} \geq 5$ degrees, it is possible to realize the distributions which are flat and higher at the central portion and at the periphery.

Figure 18:
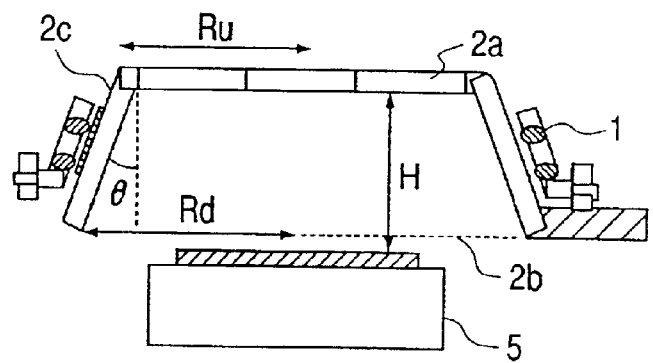
FIG. 18 shows a plasma processing apparatus of a tenth embodiment of the invention.

FIG. 18 shows a tenth embodiment of the invention. The basic apparatus construction of the present embodiment is identical to that of the eighth embodiment, but what is different from the other embodiments is that the ratio H/R of the height H (i.e., the distance from the electrode 5 to the upper face 2a) of the vacuum chamber 2 to the lower surface radius Rd of the vacuum chamber 2 is H/R≦1. This relation is satisfied, for example, by the shape of the vacuum chamber of FIG. 24(a).

Figure 19:
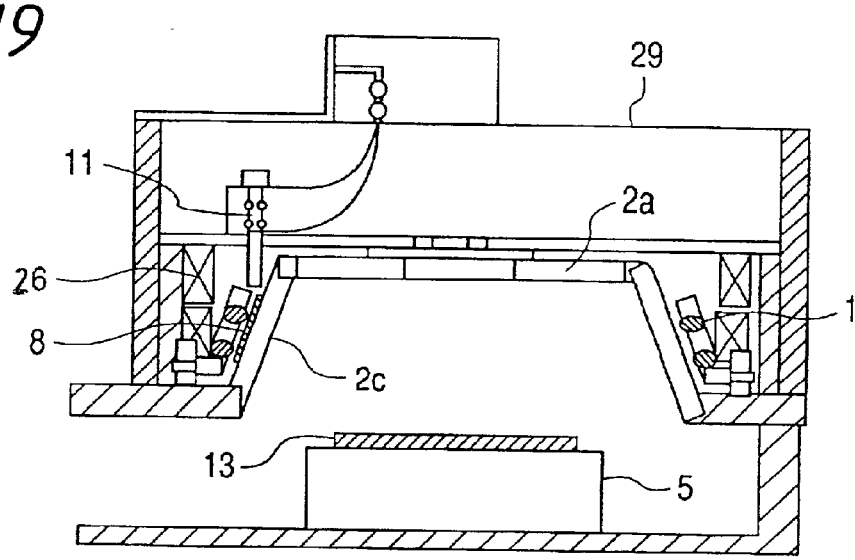
FIG. 19 shows a plasma processing apparatus of an eleventh embodiment of the invention.
Figure 25:
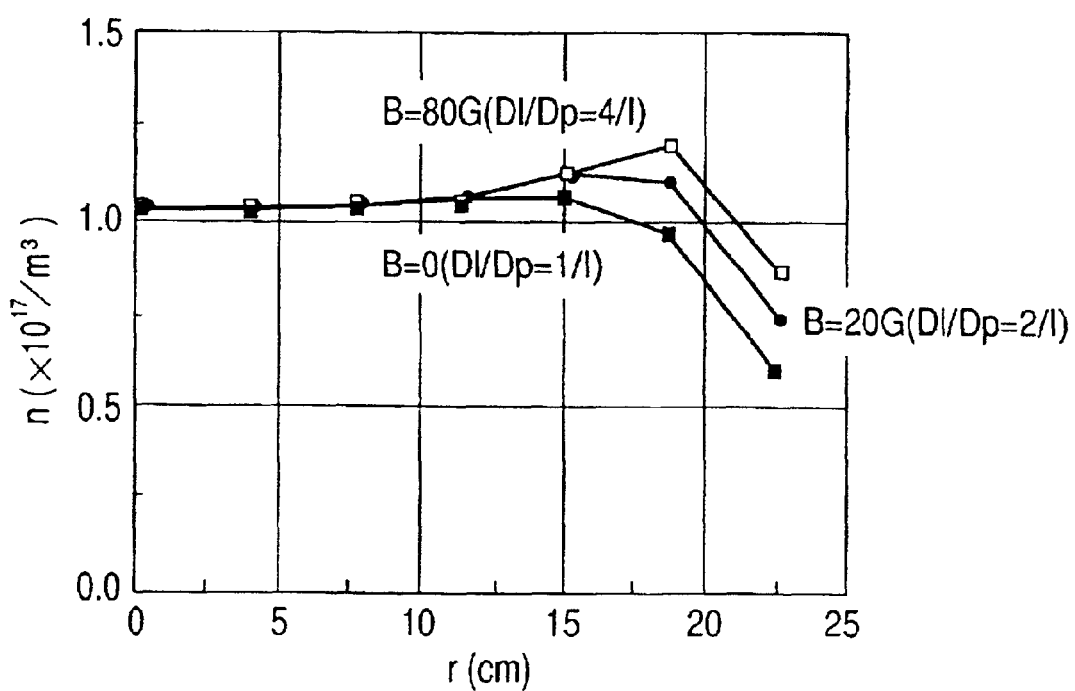
FIG. 25 is a diagram illustrating the effects of the fourth embodiment of the invention.

FIG. 19 shows an eleventh embodiment of the invention. The basic apparatus construction of the present embodiment is identical to that of the eighth embodiment, but what is different from the other embodiments is that magnetic field generating means 16 is disposed outside the vacuum chamber 1. In FIG. 19, as well as in FIG. 20, reference character II is a connector for the Interconnecting cable for the RF power supply. The plasma density distribution just above the substrate in the presence of the magnetic field is illustrated in FIG. 25. From the graph showing the plasma density distribution, it is found that the plasma density is higher in the periphery as the magnetic field is increased. Thus, the magnetic field generating means acts as an auxiliary one capable of controlling the distribution.

Parameter D1 in FIG. 25 indicates a diffusion coefficient toward the magnetic field direction, and parameter Dp in FIG. 25 indicates the diffusion coefficient in a direction perpendicular to the magnetic field.

Figure 20:
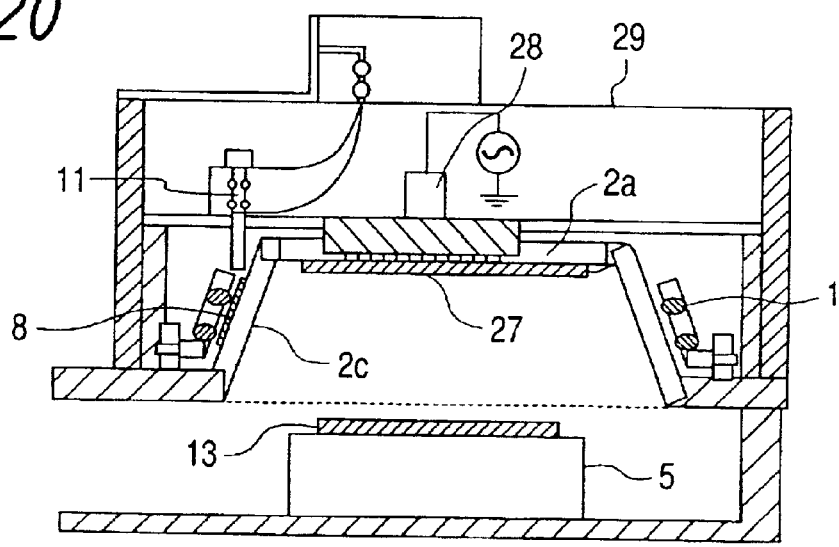
FIG. 20 shows a plasma processing apparatus of a twelfth embodiment of the invention.
Figure 21A:
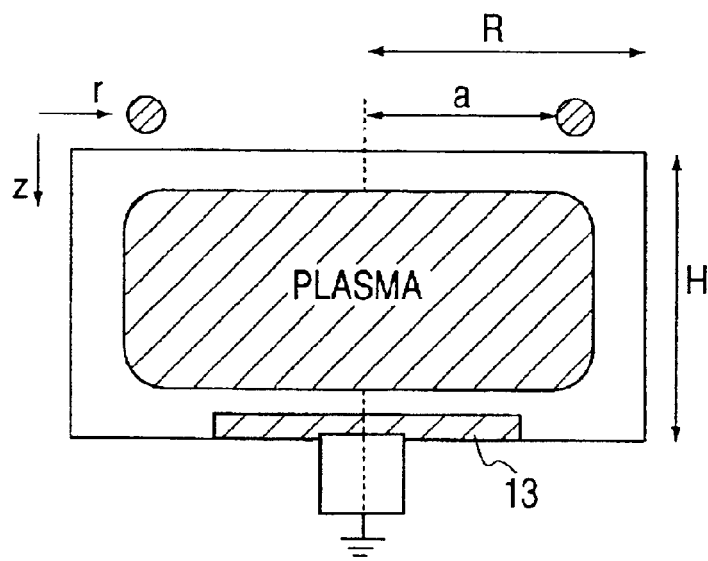
FIGS. 21(b)-21(d) show the plasma density distribution when the antenna is placed on the upper face of the plasma processing apparatus as shown in FIG. 21(a).
Figure 21B:
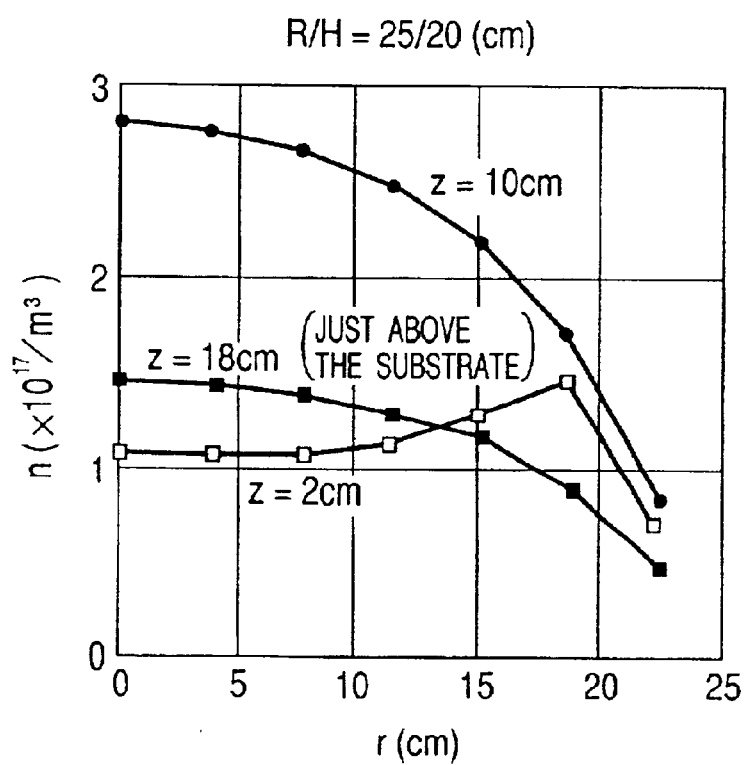
Figure 21C:
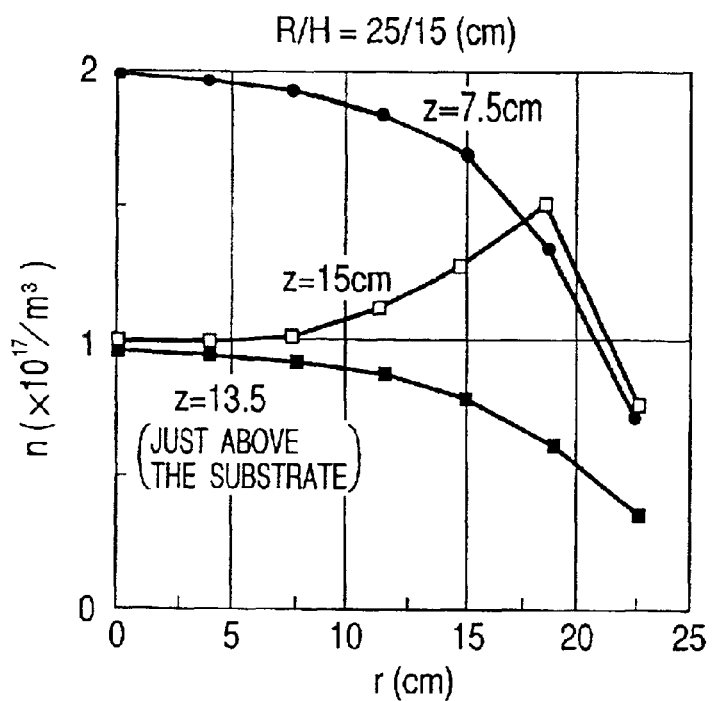
Figure 21D:
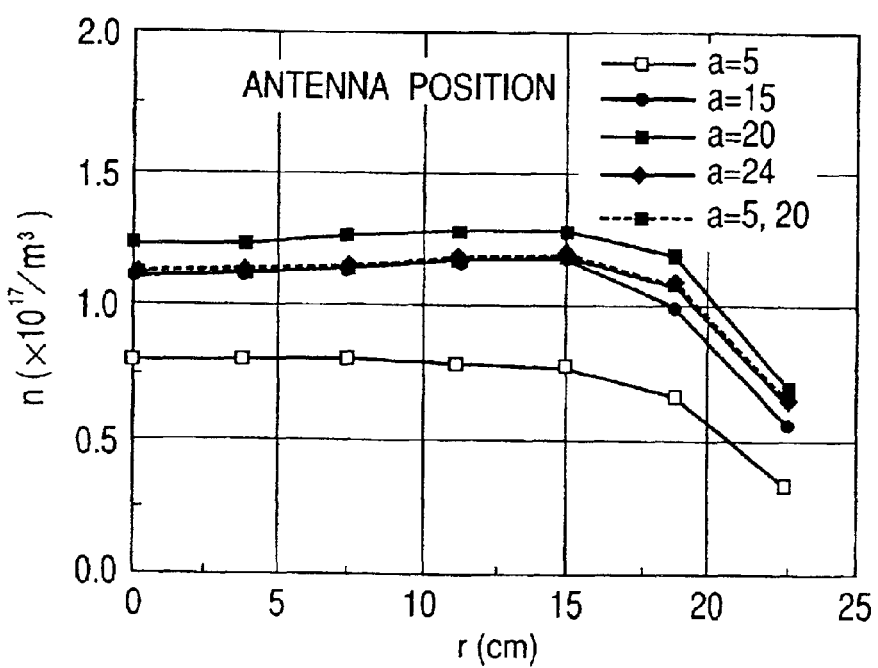
Figure 22A:
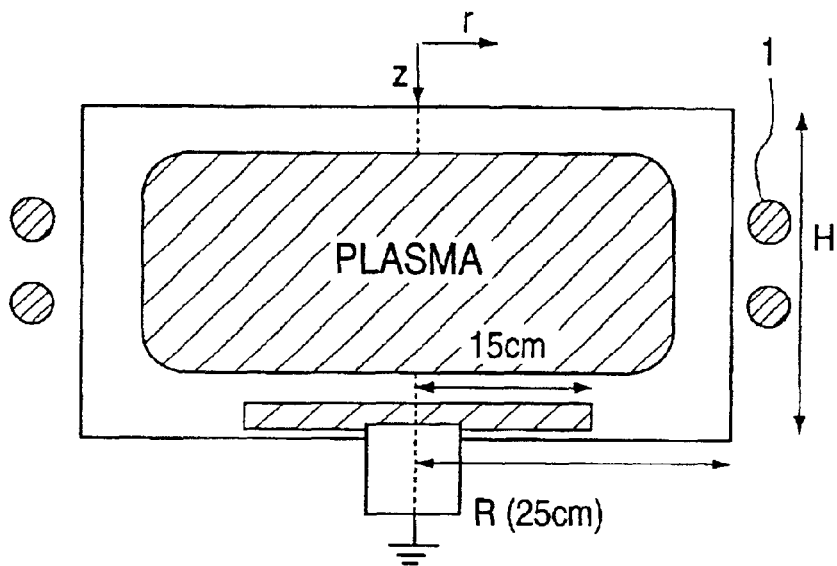
FIG. 22(b) shows the distribution of ion current incident on the wafer when the antenna is placed on the side face of the plasma processing apparatus, as shown in FIG. 22(a).
Figure 22B:
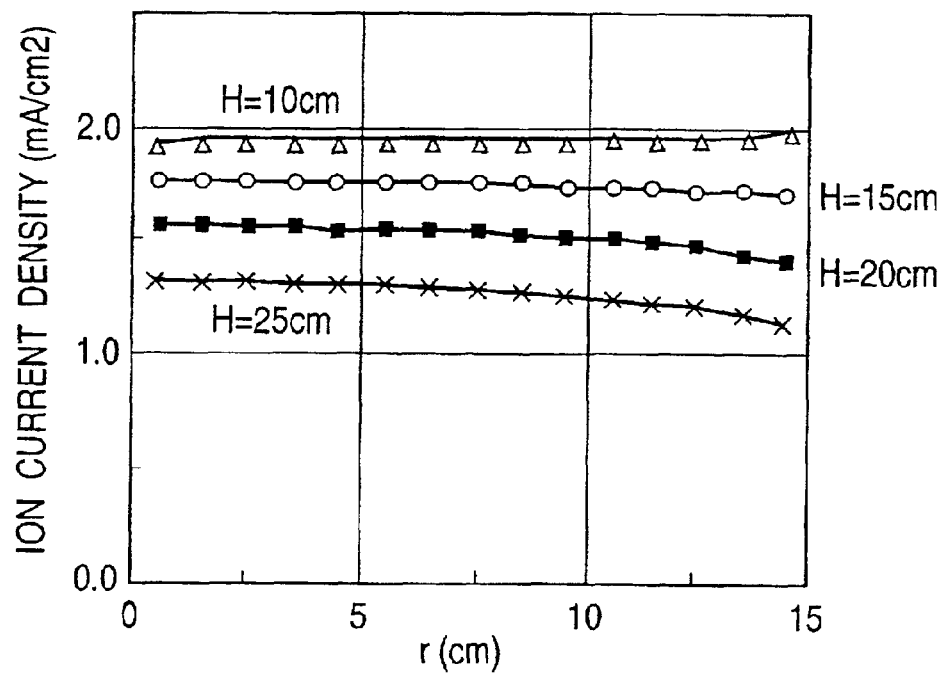

FIG. 20 shows a twelfth embodiment of the invention. The basic apparatus construction of the present embodiment is identical to that of the eighth embodiment, but what is different from the other embodiment is that a plate 27 made of a conductor or a semiconductor is placed on the face confronting the electrode 5 or on the inner side of the upper face 2a of the vacuum chamber. Moreover, radio-frequency voltage applying means 28 is preferably connected with the plate 27 to apply radio-frequency waves. Instead of the radio-frequency waves a pulsating DC voltage may be used. Alternatively, the plate 27 may be grounded to the earth.

By employing the present embodiment, the partial removal of the vacuum chamber wall enclosing the plasma generating portion by the plasma can be controlled while improving the plasma ignitability.

Moreover, by varying the degree and position of the coupling of the plasma and the antenna according to the arrangement of the antenna, the number of turns of the coil of the antenna, the distance between the antenna and the vacuum chamber and so on, the plasma distribution can be controlled to establish a uniform plasma.

What is claimed is:

1. A plasma processing apparatus comprising:
   a vacuum chamber having a structure that surrounds a space where the plasma is generated;
   a sample stage disposed in the chamber on which a sample to be processed is placed;
   a coil antenna providing an electric field to the space wherein the structure has a non-conductive member covering the space and a conductive member buried in said non-conductive member and covering said space, both which are disposed between said antenna and said space, and
   said conductive member is electrically floated at least when the plasma is generated.

2. The plasma processing apparatus according to claim 1; wherein said conductive member comprises a film layer.

3. The plasma processing apparatus according to claim 1; wherein said conductive member comprises a film layer that is fused to said non-conductive member.

4. The plasma processing apparatus according to claim 1; wherein said conductive member comprises a film layer that is coated on said non-conductive member.

5. A plasma processing apparatus comprising:
   a vacuum chamber having a structure that surrounds a space where the plasma is generated;
   a sample stage disposed in the chamber on which a sample to be processed is placed;
   a coil antenna providing an electric field to the space wherein the structure has a non-conductive member surrounding the space and a conductive member buried in or covering said non-conductive member both which are disposed between said antenna and said space, wherein the conductive member and non-conductive member are made up of materials that are fusible with each other; and
   said conductive member is electrically floated at least when the plasma is generated.

6. The plasma processing apparatus of claim 5 wherein the conductive member is made of aluminum and the non-conductive member is made of alumina.

7. Plasma processing apparatus comprising:
   a vacuum chamber having a portion consisting of non-conductive material which surrounds a space, inside of said portion, where gases are supplied and a plasma is generated using said gases;
   a sample stage disposed in the vacuum chamber, on which a sample to be processed is placed; and
   a coil antenna wound outside said portion, providing an electric field to the space for generating said plasma,
   wherein said portion has an electrically conductive film, functioning as a Faraday shield, coated on a surface inside said vacuum chamber which covers said portion and faces to the plasma, and
   wherein said electrically conductive film is electrically floated at least when the plasma is generated.

8. Plasma processing apparatus according to claim 7, wherein said gases include oxygen, said plasma is generated using said gases including oxygen so that oxidized material on the surface of said sample is processed, said electrically conductive film is made of electrically conductive aluminum, and said non-conductive material is an insulating aluminum material.

9. Plasma processing apparatus according to claim 8, wherein said insulating aluminum material is alumina.

10. Plasma processing apparatus according to claim 7, wherein said gases include at least one of chlorine and boron trichloride, and said plasma is generated using the at least one of chlorine and boron trichioride so that metal material on the surface of said sample is processed, said electrically conductive film is made of SiC, and said non-conductive material is alumina.

11. Plasma processing apparatus according to claim 10, wherein said gases include a mixture of chlorine and boron trichloride.

12. Plasma processing apparatus according to claim 7, wherein said electrically conductive film is exposed to the plasma.

13. Plasma processing apparatus according to claim 7, wherein material of the electrically conductive film and the non-conductive material are fusible with each other.

* * * * *